United States Patent [19]
Betsch et al.

[11] Patent Number: 5,202,818
[45] Date of Patent: Apr. 13, 1993

[54] SEALED SWITCHGEAR CABINET

[75] Inventors: Frédéric Betsch, Bettwiller; Pierre Carle, "Chevillard", both of France; Luis Xaus, Barcelona, Spain; Roland Goutay, Grenoble, France

[73] Assignee: Merlin Gerin, Meylan, France

[21] Appl. No.: 529,542

[22] Filed: May 29, 1990

[30] Foreign Application Priority Data

Jun. 5, 1989 [FR] France ................................ 89 07506

[51] Int. Cl.⁵ .............................................. H02B 1/01
[52] U.S. Cl. ..................................... 361/429; 211/189; 312/265.1; 312/257.1; 361/390
[58] Field of Search ............ 211/189; 312/140, 257 R, 312/265.1; 361/390, 391, 429, 356

[56] References Cited

U.S. PATENT DOCUMENTS

| | | | |
|---|---|---|---|
| 4,017,134 | 4/1977 | Lenglin et al. | 361/390 |
| 4,754,368 | 6/1988 | Nilsson | 361/390 |
| 4,814,942 | 3/1989 | Robirds et al. | 361/390 |
| 4,869,380 | 9/1989 | Metcalfe et al. | 361/429 |
| 4,958,259 | 9/1990 | Berg et al. | 361/429 |
| 5,001,602 | 3/1991 | Suffi et al. | 361/429 |

FOREIGN PATENT DOCUMENTS

| | | | |
|---|---|---|---|
| 0281983 | 9/1988 | European Pat. Off. | |
| 8335383 | 5/1984 | Fed. Rep. of Germany. | |
| 0586578 | 1/1978 | U.S.S.R. | 361/390 |

Primary Examiner—Gregory D. Thompson
Attorney, Agent, or Firm—Parkhurst, Wendel & Rossi

[57] ABSTRACT

The framework of a switchgear cabinet is formed by identical frame sections in the shape of corner-pieces whose edges are folded at right angles to form folded ends. The edges of the corner-pieces are moreover joined together by a diagonal sealing partition which provides the sealing between the two panels of the cabinet forming the angular junction. The panels with folded edges are fixed to the frame sections by parts.

7 Claims, 5 Drawing Sheets

SEALED SWITCHGEAR CABINET

BACKGROUND OF THE INVENTION

The invention relates to an electrical or electronic switchgear cabinet having walls formed by panels or plates affixed to lengthwise elements arranged at the corners of the cabinet. The lengthwise elements are fixed to each other at their ends to form a support framework. The lengthwise elements are formed by identical tubular frame sections having two orthogonal faces facing the inside of the cabinet and are provided with rows of holes to secure transverse support struts for switchgear Sealing between the panels and the support framework is ensured by a seal fitted in between the edges of the panels and corresponding frame sections.

Standardization and series manufacturing requirements impose the restriction of using a limited number of components which can form cabinets of different sizes and which meet the requirements of switchgear fixing and of juxtaposition in switchboards. The cabinet is formed by a framework achieved by assembling standard frame sections, and then by assembling panels generally made of sheet metal to this framework. These cabinets are often large in size, several meters in height, and the elastic seals inserted between the components (framework and panels) are often insufficient to make up for machining imperfections or local deformations occurring during assembly. It has already been proposed to separate the support functions and the sealing functions of the frame sections constituting the framework, by fitting extensions on the frame sections cooperable with the seals. These frame sections are complicated in shape and are often dissymmetric, which makes assembly complicated and may give rise to incorrect assembly.

An object of the invention is to achieve a cabinet using a standard frame section which both performs a support function and provides improved sealing opposite the junctions.

SUMMARY OF THE INVENTION

The cabinet according to the present invention is characterized in that the frame section is formed by a corner-piece, both sides of which are disposed inside the cabinet to form two orthogonal fixing. Each side has a longitudinal edge, opposite the apex of the corner-piece, and is folded inwards into a bracket-shape with a truncated profile. The edge of a conjugate panel is pressed against this folded end. The frame section has an external partition connecting the folded ends of the corner-piece. The frame section has a symmetry plane corresponding to the plane bisecting the corner-piece, and has a cross section which is an isosceles right triangle, the sides defining the legs and the external partition defining the hypotenuse.

The diagonal external partition separates the internal sealed area of the cabinet from the external non-sealed area. The panels are applied against the external edges of the frame section with a seal interposed, therebetween advantageously formed by an elastic pad. The bracket-shaped fold of the folded end of the frame section extends parallel to the adjacent panel a small distance from the latter and forms a screen protecting the seal, notably against water splashings from outside. The panels have folded edges which cover the folded ends of the frame section in such a way as to provide additional protection by forming a seal access labyrinth (i.e., indirect access to the seal). The folded edges of the panels naturally contribute to the rigidity and to the aesthetic appearance of the cabinet. The screening role of the folded ends of the frame sections is particularly useful when these frame sections are fitted as upper transverse struts. The water running off the roof is then collected by the gutter formed by the folded end. This gutter role is indispensable when the adjacent panel is arranged as a door, so as prevent the water that has accumulated from flowing into the cabinet when the door is opened. In this arrangement it is advantageous to move the seal towards the extremity of the folded end to prevent a water accumulation channel from forming between the panel and the folded end of the frame section.

The panels can be affixed by any appropriate means directly to the frame sections or to the folded ends of the latter. A preferred fixing mode utilizes an intermediate part, itself fixed to the diagonal partition. This intermediate part is common to the two angular panels, which are secured by simple screws engaged in bored holes of the intermediate part. This intermediate part can be arranged as or bear the hinge of a movable panel forming a door. The frame sections are assembled to one another by tripod-shaped angle parts. These angle parts fitted at the eight corners of the cabinet are, like the frame sections, identical symmetrical parts preventing any assembly error. The assembly is particularly simple and the frame sections provide modularity and optimum rigidity. Several frameworks can be adjoined and secured to one another to form cabinets of multiple sizes, the intermediate panel naturally being removed so as to join the frame sections of two adjacent frameworks together, having a seal, like the one used for the panels fitted between the frameworks. The truncated external profile of the frame sections contributes to the rigidity of these assemblies, which comprise bolts or fish plates joining the frame sections together. Extensions of this kind can be made on all the faces of the cabinet while preserving perfect sealing and without modifying the panels forming the walls.

The frame sections can be partially dovetailed in pairs, which facilitates their storage and transport.

BRIEF DESCRIPTION OF THE DRAWINGS

Other advantages and features will become more clearly apparent from the following description of an illustrative embodiment of the invention, given as a non-restrictive example only and represented in the accompanying drawings, in which.

DESCRIPTION OF THE PREFERRED EMBODIMENT

In the Figures, an electrical switchgear cabinet is formed by assembly of twelve angular elements forming a straight rectangular parallelepiped. The frame sections 10, 12, 14, 16 forming the uprights or vertical angular elements and the frame sections 18, 20, 22, 24 of the upper part of the framework, and the frame sections 26, 28, 30, 32 of the lower part of the framework are all identical and disposed in the same manner.

Figure 4:
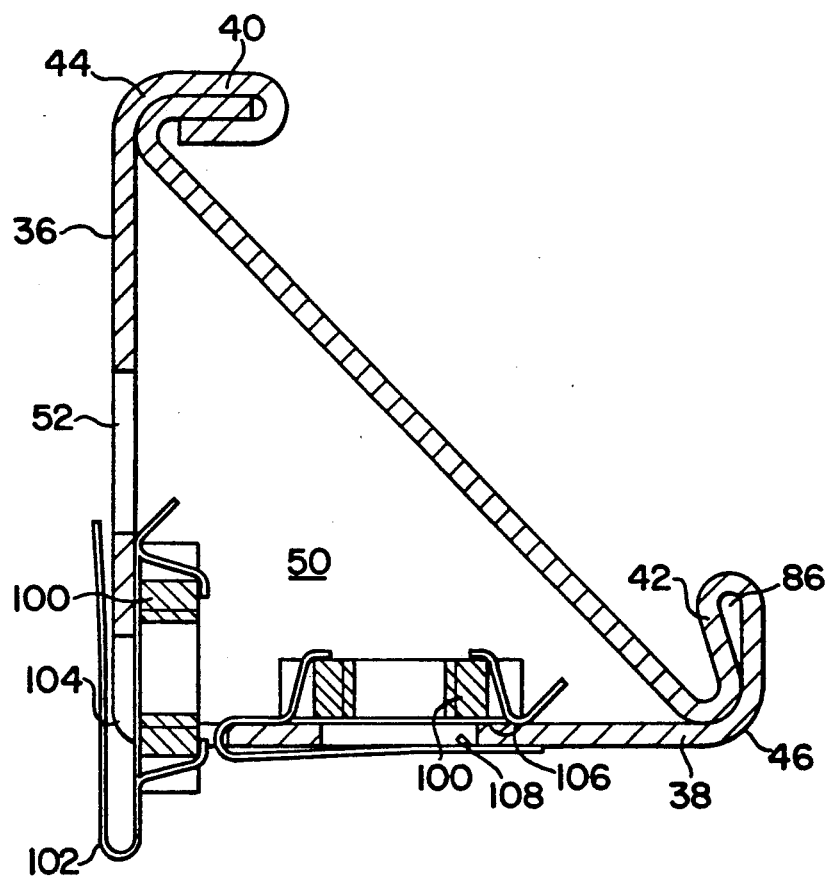
FIG. 4 is a section of the frame section constituting the framework according to FIG. 1.
Figure 5:
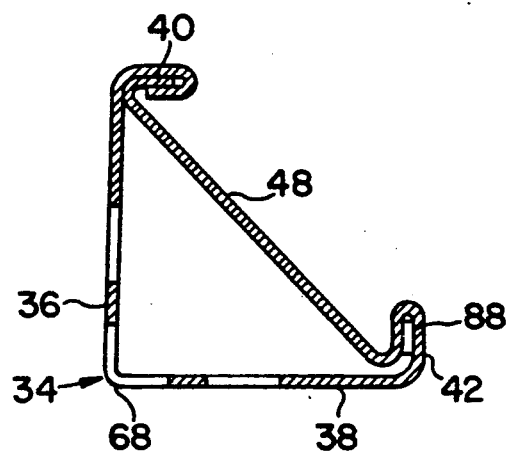
FIG. 5 is a similar view to that of FIG. 4, illustrating an alternative embodiment.

Referring more particularly to FIGS. 4 and 5, it can be seen that the frame sections 10 to 32 have a corner-piece 34 the two sides 36, 38 of which are orthogonal and present longitudinal ends folded in a bracket-shape to obtain a folded ends 40, 42 facing inwards. The edges 44, 46 constituted by the folded ends 40, 42 are connected by an external partition 48 defining with the corner-piece 34, a tubular internal space 50 of triangular cross-section. The two sides 36, 38 of the corner-piece 34 are provided with rows of holes 52 to secure transverse struts 53 supporting the electrical switchgear housed in the cabinet in a manner well-known to those specialized in the art. The transverse struts 53 are fixed to the corner-pieces 34 by screws whose nuts are inserted in the frame section. The external partition 48 which extends along the hypotenuse of the triangular frame section is a partition which is either solid or provided with a limited number of fixing holes whose usefulness will be described further on.

The framework of the cabinet is covered by panels 54, 56, respectively on the rear face and on the front face of the cabinet and by panels 58, 60 on the side faces and 62, 64 at the bottom and top of the cabinet. These panels are each formed by a metal sheet whose edges 66 are flanged at right angles to ensure the rigidity of the panel. The frame sections 10, 12, 14, 16, 18, 20, 22, 24, 26, 28, 30, 32 are all disposed in the same way with the apex 68 of the corner-piece 34, corresponding to the apex of the right angle of the right-angle triangle, facing the inside of the cabinet. Seals 70 are disposed between the panels 54 to 64 and edges 44 and 46 of the folds or folded ends 40, 42, seals 70 extending around the periphery of the panel. The panels 54, 56, 58, 60, 62, 64 are fixed to the frame sections 10, 12, 14, 16, 18, 20, 22, 24, 26, 28, 30, 32 by screws 72 which are screwed into intermediate parts 74 joined to the external partition 48. Fixing of the intermediate parts can be achieved by any suitable means, for example by sticking or quite simply by screws passing through holes arranged in the partition 48.

The same intermediate part 74 serves the purpose of fixing both the panels forming at an edge of the cabinet. This intermediate part is contained within the span of the frame section and presents a cut-out 76 accommodating the edges 66 of the panels 54, 56, 58, 60, 62, 64. Fixing of the panels 54, 56, 58, 60, 62, 64 can naturally be achieved in a different manner, the screws 72 being able, for example, to take their bearing on the folded ends 40, 42 or directly on the partition 48.

When one of the panels, notably the front panel 56, is arranged as a door, the corresponding intermediate part 78 is shaped to form a support hinge 80 of the front panel 56. The hinge 80 is contained within the span of the frame section. The front intermediate part, disposed on the moving side of the 56, can be identical to the others, or not be provided with one of the fixing points rendered of no use by the presence of the door 56.

Figure 1:
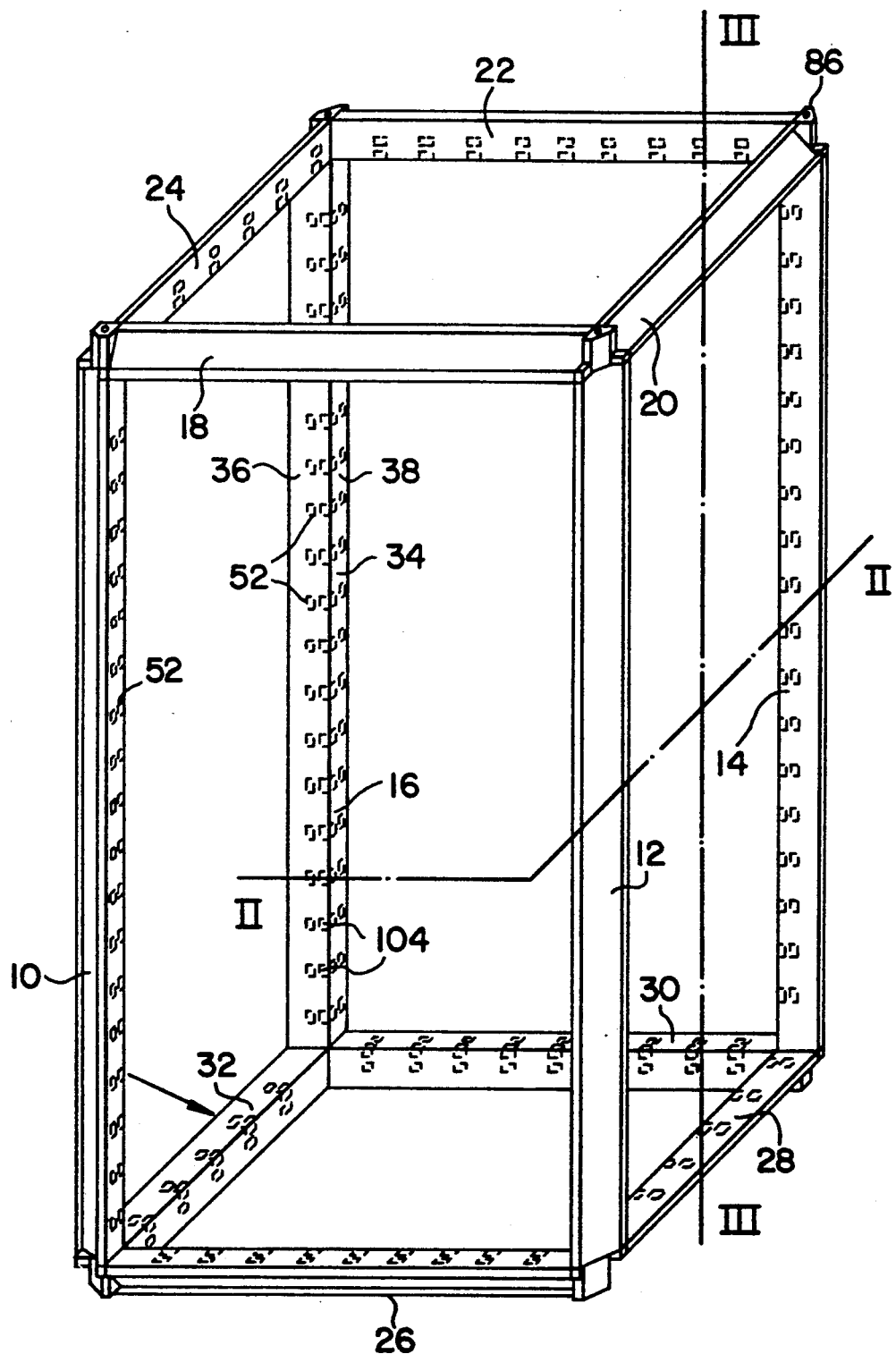
FIG. 1 is a schematic perspective view of a framework of a cabinet according to the invention.
Figure 2:
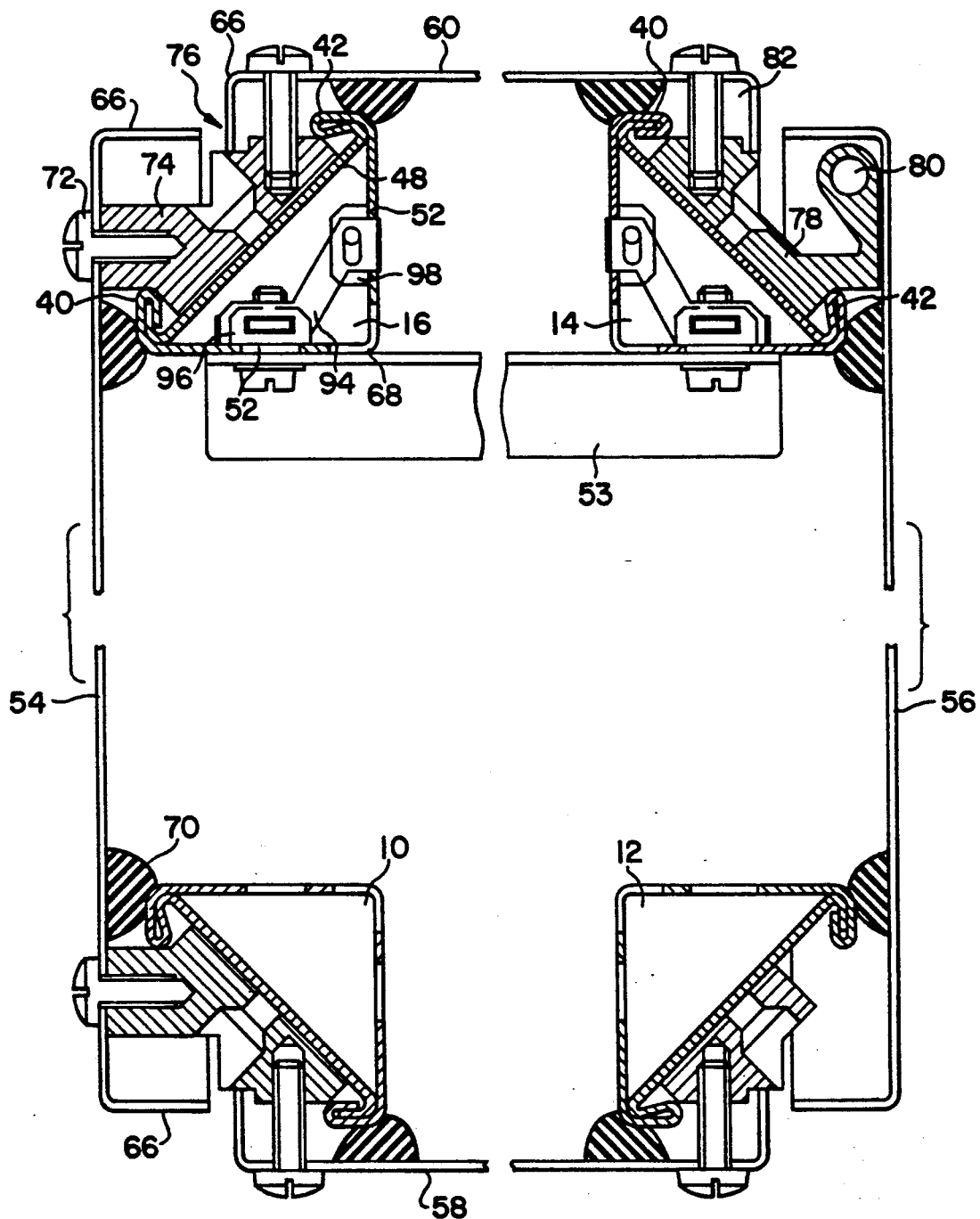
FIG. 2 is a cross-section along the line II—II of FIG. 1.
Figure 3:
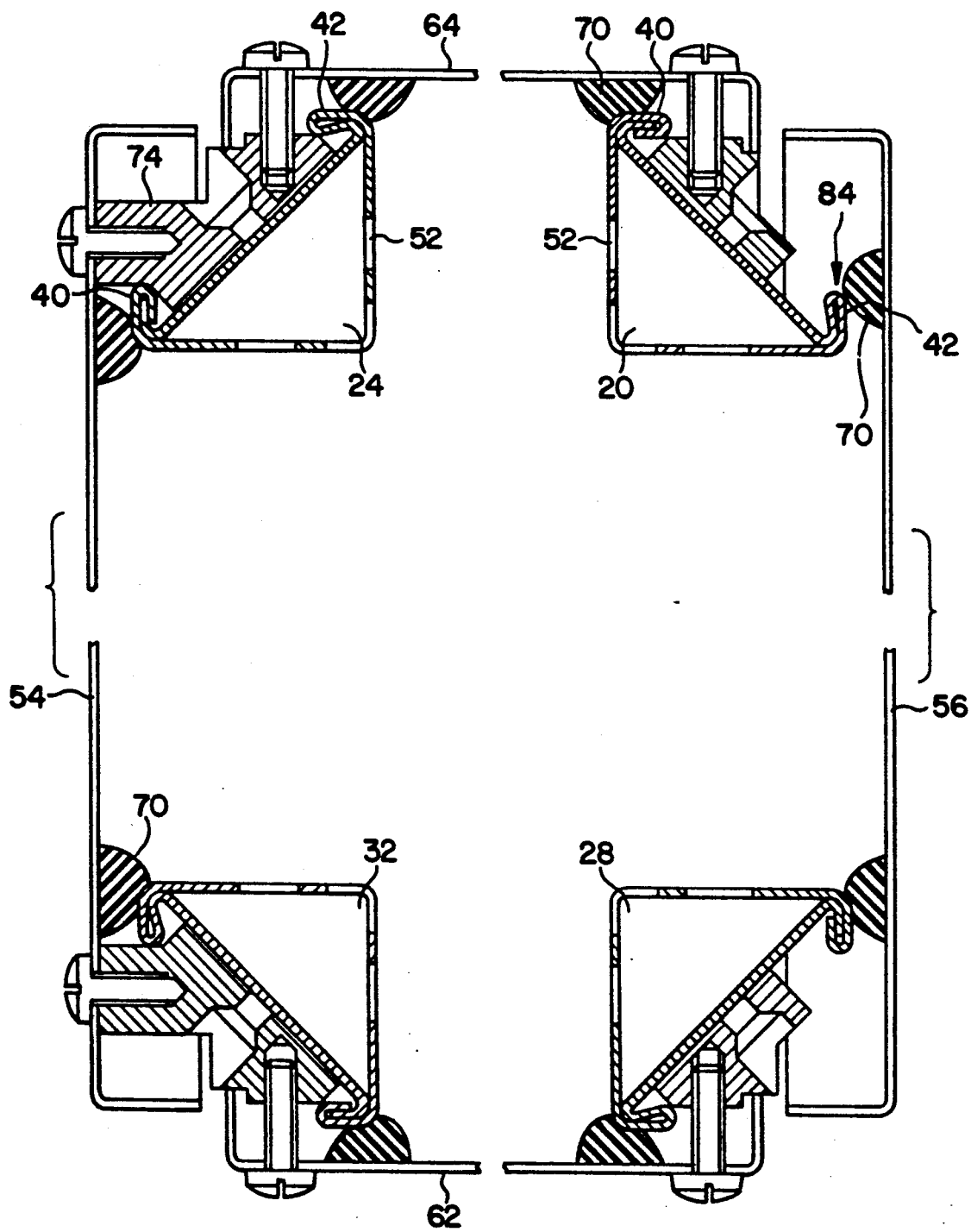
FIG. 3 is a cross-section along the line III—III of FIG. 1.

Referring more particularly to FIG. 2, it can be seen that the set of seals 70 cooperating with the vertical frame sections 10 to 16, cooperate with the edges 44, 46, constituted by the folded ends 40, 42. The tightness between two adjacent panels, for example panels 54, 60, is achieved by means of the seals 70 and the external partition 48. The partition 48 forms a separation of a sealed internal area, in which the sides 36, 38 of the corner-piece 34 extend on which the transverse struts or other switchgear support rails can be fixed. On the outside of the partition 48 there extends a non-sealed area acting as fixing for the intermediate parts 74, 78 with their accessories, such as the hinge 80 or fixing screws 72. By making the elastic seals 70 bear against the edges 44, 46, a sufficient deformation is obtained to compensate for the irregularities of the profile or other deformations of the structural elements of the cabinet. Deformation of the seals 70 when the screws 72 are tightened limits the gap between the panels 54, 56, 58, 60, 62, 64 and the folded ends 40, 42 and reduces the risks of water getting in and soaking the seals 70. This risk is further reduced by the edges 66 of the panels 54 to 64 which cover the ends of the folded ends 40, 42 forming a real labyrinth seal limiting the risk of water penetrating through to the seals 70. The shape of the frame section moreover enables sealing to be ensured either with a seal stuck or clipped onto the folded ends 40, 42, or with a seal stuck or clipped inside the panels forming the covering. Sealing of the frame sections forming horizontal transverse struts can be achieved in the same way by making the seals 70 cooperate with the edges 44, 46, but according to a preferred embodiment of the invention, represented in FIG. 3, the seal 70 above the door 56 or advantageously all the seals 70 fitted between the vertical panels 54, 56, 58, 60 and the horizontal upper frame sections 18, 20, 22, 24 are slightly offset upwards so as to cooperate with the edge 84 of the folded ends 40, 42. It can easily be seen that this offset prevents water from accumulating between the panels and the folded ends 40, 42, which might affect the sealing of the cabinet or let water in when the door 56 is opened. The frame sections 10 to 32 are assembled at their ends by cubic parts 86 having three orthogonal feet fitting into the triangular ends of the frame sections. These parts are strictly identical, whatever their position. This assembly can naturally be achieved in another manner, for example by welding.

The cabinet according to the invention is achieved as follows :

The standard frame sections 10, 12, 14, 16, 18, 20, 22, 24, 26, 28, 30, 32 of suitable length are assembled by cubic parts 86 arranged at the corners of the cabinet taking care to fit the apex 68 of the corner-pieces facing the inside of the cabinet. The perfect symmetry of the frame sections prevents any error in assembly and a whole range of cabinets can be achieved, either by cutting the frame sections on request, or by keeping a stock of frame sections of different lengths, notably with a modularity of 25 mm in the three dimensions. The assembled frame sections 10, 12, 14, 16, 18, 20, 22, 24, 26, 28, 30, 32 form a solid framework on which the covering panels 54 to 64 and the transverse struts 53 or support rails of the switchgear housed inside the cabinet can be fixed. The panels 54 to 64 of suitable dimensions are then fixed on the different faces of the cabinet taking care to fit the seals 70 between the frame sections and the edges of the panels. By tightening the screws 72 onto the intermediate parts 74, secured beforehand to the external partitions 48, the panels can be screwed tight thereby deforming seals 70 bearing against the edges 44, 46 or the edges 84 of the folded ends 40, 42. The door 56 is naturally fixed by the hinge 80 supported by the intermediate part 78, and a lock (not shown) is fitted on the opposite edge of the door 56 in a manner well-known to those specialized in the art. The switchgear can naturally be fitted in the cabinet before all or some of the panels 54, 56, 58, 60, 62, 64 are fitted. The panels or the whole cabinet are extremely simple to disassemble and several frameworks can be joined together either laterally, depthwise or heightwise, while preserving the sealing and keeping the same external panels.

The frame sections 10, 12, 14, 16, 18, 20, 22, 24, 26, 28, 30, 32 can be achieved by any suitable means, for example by extrusion, but according to a preferred process, they are obtained by folding a sheet metal strip, for example on an automatic rolling machine. FIG. 4 represents an embodiment with six folds, the edges of the folded strip being fastened at the level of the folded end 40, which presents three superposed thicknesses of metal plate. Rounded edges are thus obtained capable of cooperating with the seals 70 without the risk of deterioration. The opposite folded end 42 is formed by a single fold and therefore by two thicknesses of metal plate. The symmetry can be preserved by arranging a gap 86 between the folded parts to give this folded end 42 a thickness comparable with or equal to that of the folded end 40 with three thicknesses. FIG. 5 illustrates an alternative embodiment in which the thickness of the folded end 42 is increased by insertion of a shim 88 replacing the gap 86 between the folded edges of the folded end 42.

Figure 6:
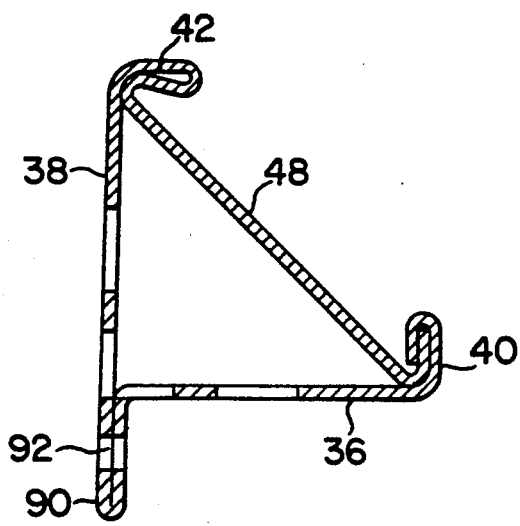
FIGS. 6 and 7 illustrate two other alternative embodiments of the frame section.
Figure 7:
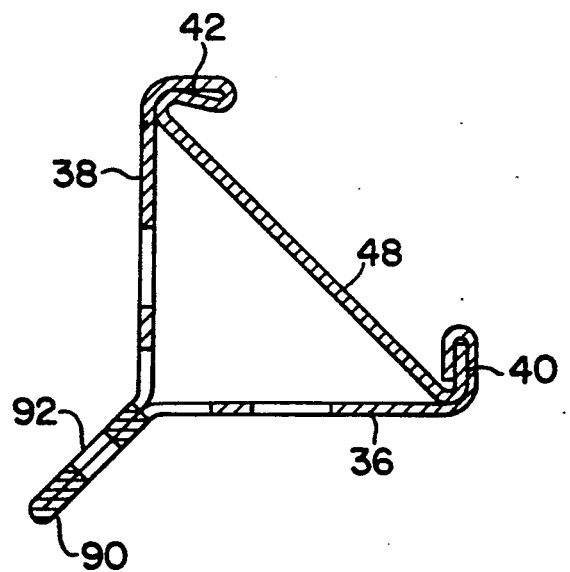

Referring now to FIGS. 6 and 7, two other alternative embodiments can be seen in which the frame section has a wing 90 which extends along the apex 68 of the corner-piece 34, protruding into the cabinet. The wing 90 comprises holes 92 to fix internal components of the cabinet. The wing 90 extends in the plane of one of the sides 38 of the corner-piece (FIG. 6) or in any other direction, notably in the plane bisecting the corner-piece (FIG. 7) and is formed by a fold of the metal plate in the manner represented in the Figures.

The structure according to the invention gives the frame section a high degree of rigidity in relation to its weight and ensures sealing while preserving the external dimensions of the cabinet enabling several frameworks to be juxtaposed easily.

The nuts of the fixing screws to the frame sections 10, 12, 14, 16, 18, 20, 22, 24, 26, 28, 30, 32 must be fitted inside these frame sections and retained opposite the hole 52 receiving the screw. In FIG. 2, a support 94 common to two nuts 96, 98 can be seen coming opposite two holes 52 located at the same level on the two wings of the corner-piece. The nut 98 is pivotally and slidably mounted on the support 94 to enable, from the active position represented in FIG. 4, downwards sliding and pivoting to place the rectangular nut on its edge enabling it to be removed via the hole 52.

FIG. 4 represents a nut 100 mounted in a bracket-shaped cage 102. The frame section 10, 12, 14, 16, 18, 20, 22, 24, 26, 28, 30, 32 comprises on the apex 68 holes 104 at the pitch and level of the holes 52 of the sides 36, 38 to enable the nut 100 to be inserted in the frame section while being retained by the bracket-shaped cage 102 which overlaps the side. The figure shows a nut fitted in place on one of the sides 38 opposite the hole 52 and another nut being inserted to be positioned opposite the hole 52 of the other side 36. The folded steel cage 102 has a pin 106 which is pressed by the tightening force into the frame section to ensure electrical continuity. A folded lug 108 clips into the hole 52 to center the nut.

We claim:

1. A parallelepipedic cabinet having twelve edges, comprising:
    a support framework formed of tubular frame sections affixed to each other at their ends to define said edges of said cabinet, each of said tubular frame sections comprising:
    (a) a corner piece having two sides which face an interior of said cabinet, holes disposed along said two sides for fixation of switchgear, and longitudinal edges defined by folded portions folded inwards substantially perpendicular to said sides;
    (b) an external sealing partition joining said longitudinal edges of said corner piece, said external sealing partition and said corner piece forming a tubular internal space having a triangular cross-section, and having a symmetry plane bisecting said corner piece;
    plates affixed to said framework defining walls of said cabinet; and
    elastic seals fitted between said plates and said folded portions of said corner pieces.

2. The cabinet of claim 1, wherein said tubular frame sections are formed of metal strips, two opposite edges of each of said metal strips being folded together in one of said folded portions.

3. The cabinet of claim 2, wherein one of said folded portions comprises three layers of said metal strip, and the other of said folded portions comprises two layers of said metal strip and one of a shim and a gap between said two layers.

4. The cabinet of claim 1, wherein said plates have inwardly perpendicularly folded edges, said folded edges forming a labyrinth seal with respective folded portions of said frame sections.

5. The cabinet of claim 1, further comprising intermediate fixing parts capable of being affixed to said external sealing partition to receive screws to fixedly secure said plates to said support framework.

6. The cabinet of claim 1, wherein said tubular frame sections further comprises a wing extending from said corner piece into an interior of said parallelepipedic cabinet.

7. The cabinet of claim 1, wherein said tubular frame sections further comprise a cage holding a nut in said tubular inner space, wherein said nut is capable of being inserted into said tubular inner space through said holes.

* * * * *